US 7,446,564 B2

(12) United States Patent
Huang

(10) Patent No.: US 7,446,564 B2
(45) Date of Patent: Nov. 4, 2008

(54) LEVEL SHIFTER

(75) Inventor: Yo-Lih Huang, Sindian (TW)

(73) Assignee: VIA Technologies, Inc., Sindian, Taipei County (TW)

( * ) Notice: Subject to any disclaimer, the term of this patent is extended or adjusted under 35 U.S.C. 154(b) by 283 days.

(21) Appl. No.: 11/023,447

(22) Filed: Dec. 29, 2004

(65) Prior Publication Data

US 2005/0156631 A1    Jul. 21, 2005

(30) Foreign Application Priority Data

Jan. 15, 2004    (TW) ............................... 93101036 A

(51) Int. Cl.
*H03K 19/0175* (2006.01)
(52) U.S. Cl. .......................................... 326/68; 326/81
(58) Field of Classification Search ............. 326/62–68, 326/80–87
See application file for complete search history.

(56) References Cited

U.S. PATENT DOCUMENTS

| 5,821,800 | A  | * | 10/1998 | Le et al. ..................... 327/333 |
| 5,969,542 | A  | * | 10/1999 | Maley et al. .................. 326/81 |
| 6,064,229 | A  | * | 5/2000  | Morris ......................... 326/81 |
| 6,487,687 | B1 | * | 11/2002 | Blake et al. .................. 714/724 |
| 6,700,407 | B1 | * | 3/2004  | Wert ............................ 326/81 |
| 6,963,226 | B2 | * | 11/2005 | Chiang ......................... 326/68 |
| 7,053,658 | B1 | * | 5/2006  | Blankenship et al. ......... 326/81 |
| 2006/0091907 | A1 | * | 5/2006 | Khan ........................... 326/81 |

* cited by examiner

*Primary Examiner*—Don P Le
(74) *Attorney, Agent, or Firm*—Bacon & Thomas, PLLC

(57) ABSTRACT

A level shifter is disclosed, which has an input control circuit, a high-level voltage supply and a step-down circuit. The high-level voltage supply provides a high-level voltage source. The step-down circuit is coupled between the input control circuit and the high-level voltage supply circuit, and includes a high-level control device and a low-level control device. The high-level control device can provide a step-down function for protecting the low-level control device. The low-level control device is control to switch by the control signal or the inverted control signal, thereby driving the high-level voltage source to output.

10 Claims, 2 Drawing Sheets

LEVEL SHIFTER

BACKGROUND OF THE INVENTION

1. Field of the Invention

The present invention relates to a technical field of level shifter and, more particularly, to a level shifter for low to high voltage conversion.

2. Description of Related Art

Most level shifters are applied for voltage conversion, such as a control signal conversion from low voltage to high. Due to few required electronic devices and easier implementation, a level shifter is widely applied in scan drivers of computer systems and flat displays.

FIG. 1 is a schematic diagram of a typical level shifter. In FIG. 1, the typical level shifter consists of an input-stage level shifter 11, a first output circuit 12 and a second output circuit 13. The level shifter 11 consists of high-voltage devices including PMOSs 111, 112 and NMOSs 113, 114, and an inverter 115 driven by a low-level voltage source VDD. The first output circuit 12 consists of PMOS 121 and NMOS 122. The second output circuit 13 consists of PMOS 131 and NMOS 132.

As shown in FIG. 1, the input-stage level shifter 11 uses an input signal A (at a low-level voltage source VDD of which can provide a low voltage of 0V and a high voltage range of 2.3~2.5V) to control PMOSs 111, 112 and NMOSs 113, 114 for outputting a high-level voltage signal VPP (normally at 3.3 V) through the first and second output circuits 12 and 13. Signals outputted by the circuits 12 and 13 have opposite phases.

When an input signal A of 2.5V is entered to the input of the inverter 115, a gate of NMOS 113 receives a control signal of 0V and a gate of NMOS 114 receives a control signal of 2.5V. Thus, NMOS 113 is turned off and NMOS 114 is turned on. Next, PMOS 111 is turned on, PMOS 112 is turned off, PMOS 121 is turned on, and NMOS 122 is turned off. Accordingly, point B outputs a 3.3V VPP signal as a high-level control signal. In addition, PMOS 131 is turned off and NMOS 132 is turned on, so PMOS 131 is turned off and NMOS 132 is turned on. Point C outputs a 0V high-level control signal.

Similarly, when the input signal A is a 0V control signal, NMOS 113 is turned on, NMOS 114 is turned off, PMOS 111 is turned off, PMOS 112 is turned on, PMOS 121 is turned off, and NMOS 122 is turned on, so that point B outputs a 0V high-level control signal. In addition, PMOS 131 is turned on and NMOS 132 is turned off, so that point C outputs another high-level control signal with 3.3V VPP.

However, the above circuit encounters problems. Since current ICs are usually formed by advanced processes, low-level voltage source VDD becomes lower and lower (for example, as low as 1~1.5V). Thus, a lower voltage source VDD may not turn on the threshold voltage of a high-voltage NMOS device (such as 113 and 114 of FIG. 1). That is, a low-level voltage source cannot turn on a high-voltage device as it provides a voltage smaller than a threshold voltage of the high-voltage device. Therefore, the entire level shifter cannot work. In addition, when a high voltage of the low-level voltage source VDD is too low (1~1.5V), which is slightly higher than the threshold voltage of the high-voltage device, an output signal of the voltage source VDD has unbalanced rising/falling waveforms and thus the level shifter has longer transition time.

Therefore, it is desirable to provide an improved level shifter to mitigate and/or obviate the aforementioned problems.

SUMMARY OF THE INVENTION

An object of the present invention is to provide a level shifter, which provides a balanced duty cycle and rising/falling transition speed at different input voltages.

Another object of the present invention is to provide a level shifter, which increases circuitry reliability and operation stability.

To achieve the above objects, the level shifter of the present invention includes an input control circuit, a high-level voltage supply circuit and a step-down circuit. The input control circuit receives a control signal with a low-level voltage source for producing a phase-inverted control signal. The high-level voltage supply circuit provides a high-level voltage source. The step-down circuit is coupled between the input control circuit and the high-level voltage supply circuit, and includes a high-level control device and a low-level control device. The high-level control device can provide step-down function for protecting the low-level control device. The low-level control device is switched by the high-level voltage supply circuit with the control signal or the phase-inverted control signal produced by the input control circuit, thereby driving the high-level voltage source to output.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
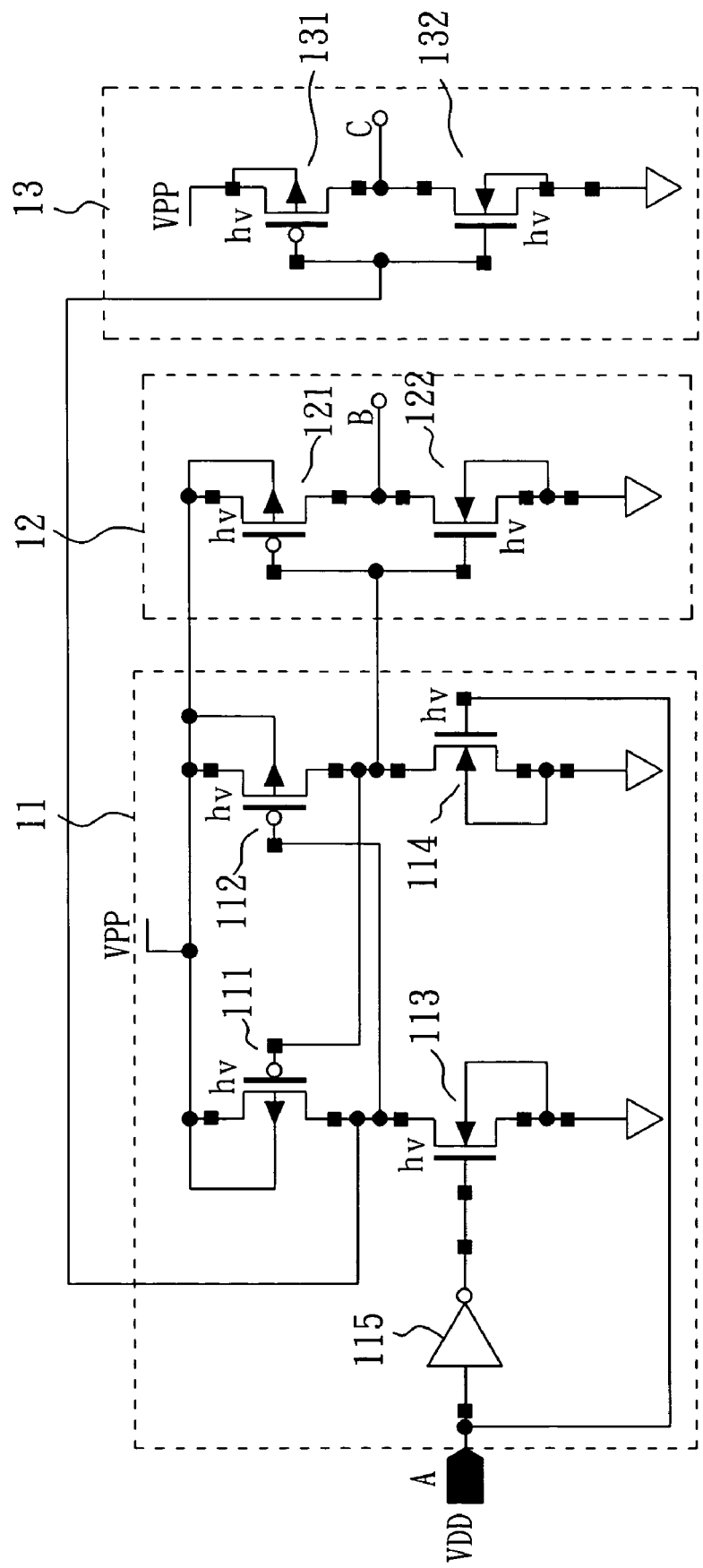
FIG. 1 is a schematic diagram of a typical level shifter.
Figure 2:
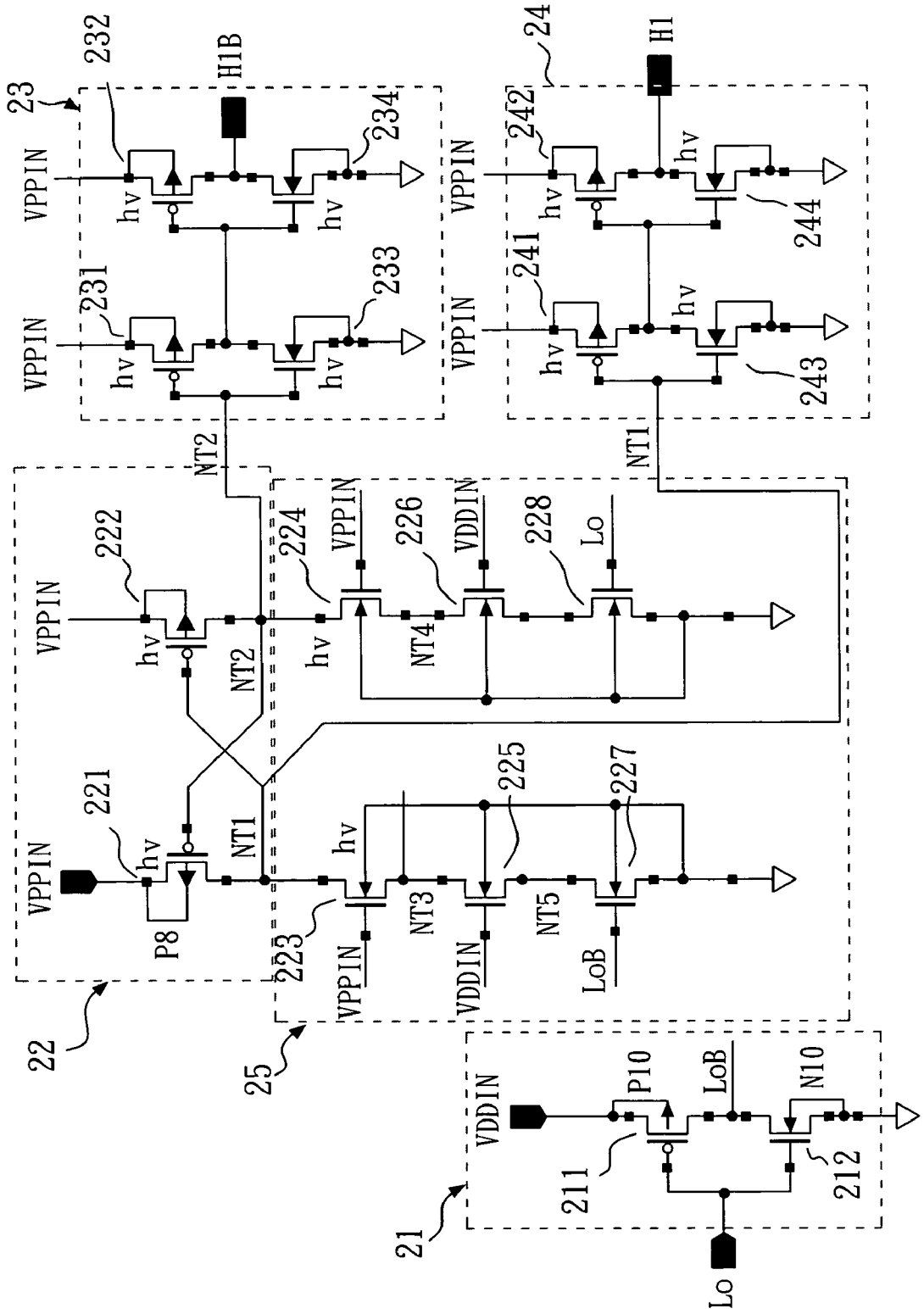
FIG. 2 is a schematic diagram of a level shifter according to an embodiment of the invention.

With reference to FIG. 2, there is shown a level shifter having an input control circuit 21, a high-level voltage supply 22, a first output circuit 23, a second output circuit 24 and a step-down circuit 25.

The input control circuit 21 consists of PMOS 211 and NMOS 212. Gates of PMOS 211 and NMOS 212 are connected together to receive an external control signal Lo. PMOS 211 has a source connected to a pin VDDIN of low-level voltage source for receiving a low-level voltage (such as 1~1.5V) and a drain connected a drain of NMOS 212 for forming a connection to a gate of NMOS 227 to thus output an inverted control signal LoB. A source of NMOS 212 is grounded.

The high-level voltage supply 22 consists of PMOSs 221 and 222. The step-down circuit 25 consists of NMOSs 223-228, wherein PMOSs 221-222 and NMOSs 223-224 are high-voltage devices (indicated by hV) and NMOSs 225-228 are typical devices. Sources of PMOSs 221-222 are connected to a pin VPPIN of high-level voltage source respectively for receiving a high-level voltage (such as 3.3V). A drain of PMOS 221, a drain of NMOS 223 and a gate of PMOS 222 are connected to form a node NT1. A drain of PMOS 222, a drain of NMOS 224 and a gate of PMOS 221 are connected to form a node NT2. Gates of NMOSs 223-224 are connected respectively to the pin VPPIN. A source of NMOS 223 is connected to a drain of NMOS 225. A source of NMOS 224 is connected to a drain of NMOS 226. Gates of NMOSs 225-226 are connected respectively to the pin VDDIN for receiving a low-level voltage source between 1 and 1.5V. A source of NMOS 225 is connected to a drain of NMOS 227. A source of NMOS 226 is connected to a drain of NMOS 228. Sources of NMOSs 227-228 are grounded.

The first output circuit 23 consists of PMOSs 231-232 and NMOSs 233-234, which are high-voltage devices. Sources of PMOSs 231-232 are connected to the pin VPPIN. Gates of PMOS 231 and NMOS 233 are connected to the node NT2. Drains of PMOS 231 and NMOS 233 and gates of PMOS 232 and NMOS 234 are connected together. A drain of PMOS 232 is connected to a drain of NMOS 234 to thus form a first output terminal H1B. Sources of NMOSs 233-234 are grounded.

The second output circuit 24 consists of PMOSs 241-242 and NMOSs 243-244, which are high-voltage devices. Sources of PMOSs 241-242 are connected to the pin VPPIN. Gates of PMOS 241 and NMOS 243 are connected to the node NT1. Drains of PMOS 241 and NMOS 243 and gates of PMOS 242 and NMOS 244 are connected together. A drain of PMOS 242 is connected to drain of NMOS 244 to thus form a second output terminal H1. Sources of NMOSs 243-244 are grounded.

When the pin VPPIN provides a high-level voltage of 3.3V, typical MOSs may be damaged or the life of associated circuitry is shortened if the gates of the typical MOSs such as NMOSs 225-228 (with a tolerable range between 1 V and 1.5 V) are provided directly with respective input signals ranging of 1.5 to 2.5 V. Hence, in the present invention high-voltage devices NMOSs 223 and 224 are cascaded respectively with typical devices NMOSs 225, 227 and NMOSs 226, 228, thus providing input signal with lower voltage level for the entire level shifter.

Since NMOSs 223 and 224 have gates respectively connected to a high-level voltage pin VPPIN directly, when the pin VPPIN provides a high-level voltage, NMOSs 223 and 224 are turned on, which normally have respective drain-to-source voltages of about 0.8 V. Similarly, since NMOSs 225 and 226 have gates respectively connected to a low-level voltage pin VDDIN, when the pin VDDIN provides a low-level voltage, NMOSs 225 and 226 are turned on, which normally have respective drain-to-source voltages of about 0.5 V. As such, when the node NT1 is at 3.3 V, a node NT5 between NMOSs 225 and 227 is at about 2 V (3.3V-0.8V-0.5V), so that NMOS 227 can be driven only by a lower input-voltage control signal, and so can NMOS 228.

When input-voltage control signal Lo is 1 V, PMOS 211 is turned off, NMOS 212 is turned on, and the gate of NMOS 227 is at 0 V, so that NMOS 228 is turned on and NMOS 227 is turned off. When NMOS 228 is on, the potential of the node NT2 is pulled down to 0V such that PMOS 221 is turned on so as to turn PMOS 231 on and NMOS 233 off and further turn PMOS 232 off and NMOS 234 on. Thus, the output terminal H1B can output a voltage signal with 0 V When NMOS 227 is off, the node NT1 stays at high potential (3.3V) so as to turn PMOS 222 off, PMOS 241 off and NMOS 243 on and further turn PMOS 242 on and NMOS 244 off. Thus, the output terminal H1 can output a high-level voltage signal with 3.3V.

Similarly, when input-voltage control signal Lo is 0 V, PMOS 211 is turned on, NMOS 212 is turned off, and the gate of NMOS 227 is at 1 V, so that NMOS 228 is turned off and NMOS 227 is turned on. When NMOS 228 is off, the potential of the node NT2 stays at high-voltage (3.3V) to turn PMOS 221 off so as to turn PMOS 231 off and NMOS 233 on and further turn PMOS 232 on and NMOS 234 off. Thus, the output terminal H1B can output a high-level voltage signal with 3.3 V. When NMOS 227 is on and PMOS 221 is off, the potential of the node NT1 is pulled down to 0V so as to turn PMOS 222 on, PMOS 241 on and NMOS 243 off and further turn PMOS 242 off and NMOS 244 on. Thus, the output terminal H1 can output a voltage signal with 0 V.

NMOSs 223, 225 and NMOSs 224, 226 can produce a voltage step-down to reduce voltage drop received by NMOSs 227, 228 at the drains and gates, thereby protecting NMOSs 227 and 228 as NMOSs 227 and 228 are typical devices with lower threshold voltages. Thus, a lower input control voltage can be applied for driving NMOSs 227 and 228 and make entire circuit work correctly. Further, at least one set of NMOSs can be added in the inventive circuitry as required for increasing voltage drop. Also, other active or passive devices to produce the voltage drop can be implemented in the cited circuit. In addition, control signals with opposite phases to the cited control signals can be used (i.e., 0V, -VDD in this case) while PMOSs and NMOSs illustrated are also transposed, which is not described more because it can easily be implemented by a person skilled in the art.

In view of the foregoing, it is known that the invention is able to reduce voltage difference of one pair of typical MOSs by cascading the typical MOSs with high-voltage MOSs, so that another pair of the typical MOSs can control the operation of the entire level shifter, thereby providing a balanced duty cycle and up/down transition speed and increasing circuitry reliability and operation stability.

Although the present invention has been explained in relation to its preferred embodiment, it is to be understood that many other possible modifications and variations can be made without departing from the spirit and scope of the invention as hereinafter claimed.

What is claimed is:

1. A level shifter, comprising:
    an input control circuit to receive a control signal with a low-level voltage source for producing an inverted control signal;
    a high-level voltage supply circuit, to provide a high-level voltage source; and
    a step-down circuit, coupled between the input control circuit and the high-level voltage supply circuit, and including a high-level control device, and a low-level control device, wherein the high-level control device is connected to and controlled by the high-level voltage source in order to provide a step-down function for protecting the low-level control device, and the low-level control device is controlled to switch by the control signal or the inverted control signal, thereby driving the high-level voltage source to output.

2. The level shifter as claimed in claim 1, wherein the input control circuit has a first switch device and a second switch device, which are not turned on and off at the same time.

3. The level shifter as claimed in claim 2, wherein the first switch device and the second switch device are a low-level controlled MOSs.

4. The level shifter as claimed in claim 1, wherein the high-level voltage supply circuit has a third switch device and a fourth switch device, which are not turned on and off at the same time.

5. The level shifter as claimed in claim 4, wherein the third switch device and the fourth switch device are high-level controlled PMOSs.

6. The level shifter as claimed in claim 1, wherein the high-level control device comprises a fifth switch device and a sixth switch device, which are high-voltage NMOSs.

7. The level shifter as claimed in claim 1, wherein the low-level control device comprises a seventh switch device and an eighth switch device, which are typical NMOSs.

8. The level shifter as claimed in claim 1, wherein the step-down circuit further comprises a ninth switch device and a tenth switch device respectively coupled between the high-level control device and the low-level control device in order to provide a further step-down function, the ninth switch device and the tenth switch device being typical NMOSs.

9. The level shifter as claimed in claim 1, further comprising: a first output circuit and a second output circuit respectively coupled between the high-level voltage supply circuit and the step-down circuit, thereby producing respective output signals.

10. The level shifter as claimed in claim 9, wherein the output signal of the first output circuit in inverted with respect to the output signal of the second output circuit.

* * * * *